United States Patent
Göttl et al.

(10) Patent No.: US 10,090,573 B2
(45) Date of Patent: Oct. 2, 2018

(54) HIGH-FREQUENCY SHIELDED HOUSING, IN PARTICULAR HIGH-FREQUENCY SHIELDED FILTER HOUSING

(71) Applicant: KATHREIN-WERKE KG, Rosenheim (DE)

(72) Inventors: Maximilian Göttl, Frasdorf (DE); Thomas Haunberger, Bad Reichenhall (DE); Manfred Stolle, Bad Aibling (DE)

(73) Assignee: Kathrein-Werke KG, Rosenheim (DE)

( * ) Notice: Subject to any disclaimer, the term of this patent is extended or adjusted under 35 U.S.C. 154(b) by 0 days.

(21) Appl. No.: 15/314,053

(22) PCT Filed: May 7, 2015

(86) PCT No.: PCT/EP2015/000932
§ 371 (c)(1),
(2) Date: Nov. 25, 2016

(87) PCT Pub. No.: WO2015/180820
PCT Pub. Date: Dec. 3, 2015

(65) Prior Publication Data
US 2017/0188491 A1    Jun. 29, 2017

(30) Foreign Application Priority Data

May 27, 2014   (DE) .................. 10 2014 007 927

(51) Int. Cl.
*H01P 1/205*     (2006.01)
*H03H 7/01*      (2006.01)
(Continued)

(52) U.S. Cl.
CPC ............ *H01P 1/2053* (2013.01); *H03H 7/01* (2013.01); *H05K 9/0009* (2013.01); *H03H 1/0007* (2013.01); *H03H 2001/0028* (2013.01)

(58) Field of Classification Search
CPC ...... H03H 1/0007; H03H 7/01; H03H 7/0138; H03H 2001/0028; H01P 1/2053
(Continued)

(56) References Cited

U.S. PATENT DOCUMENTS 5,847,317 A    12/1998  Phelps
6,078,231 A     6/2000  Pelkonen
(Continued)

FOREIGN PATENT DOCUMENTS

DE   10 2004 060 695    9/2006
DE   10 2009 025 408   12/2010
(Continued)

OTHER PUBLICATIONS

English translation of the International Preliminary Report on Patentability issued in International Application No. PCT/EP2015/000932.
(Continued)

*Primary Examiner* — Rakesh Patel
(74) *Attorney, Agent, or Firm* — Nixon & Vanderhye P.C.

(57) ABSTRACT

An improved high-frequency shielded housing is characterized by the following features, among others: multiple contact sections (K; $K_G$; $K_D$) are formed or provided arranged offset to one another between the housing cover (17) and the housing (3), galvanic separating sections (T; $T_G$; $T_D$) are formed or provided between the contact sections ($K_G$; $K_D$), the housing cover (17) and the housing (3) are galvanically separated in the regions of the galvanic separating sections, and screw connections (25) are provided in the contact sections (K; $K_G$; $K_D$), the housing cover (17) and the housing (3) being galvanically contacted in the regions of the screw connections.

21 Claims, 13 Drawing Sheets

(51) Int. Cl.
*H05K 9/00* (2006.01)
*H03H 1/00* (2006.01)

(58) Field of Classification Search
USPC .................. 333/185; 361/600, 601, 679.01
See application file for complete search history.

(56) References Cited

U.S. PATENT DOCUMENTS

| | | | |
|---|---|---|---|
| 6,307,449 B1 | 10/2001 | Matsuo et al. | |
| 2005/0253673 A1* | 11/2005 | Killer | H01P 7/04 |
| | | | 333/223 |
| 2013/0322021 A1 | 12/2013 | Ohoka et al. | |
| 2014/0055215 A1 | 2/2014 | Rogers et al. | |

FOREIGN PATENT DOCUMENTS

| | | |
|---|---|---|
| DE | 10 2010 056 048 | 6/2012 |
| EP | 0 952 765 | 10/1999 |
| EP | 2 443 694 | 4/2012 |
| WO | WO 88/01101 | 2/1988 |
| WO | WO 2006/063640 | 6/2006 |

OTHER PUBLICATIONS

International Search Report for PCT/EP2015/000932, dated Aug. 13, 2015, 6 pages.
International Preliminary Report on Patentability with Amended Sheets, (Foreign language)dated Aug. 17, 2016, 56 pages.

* cited by examiner

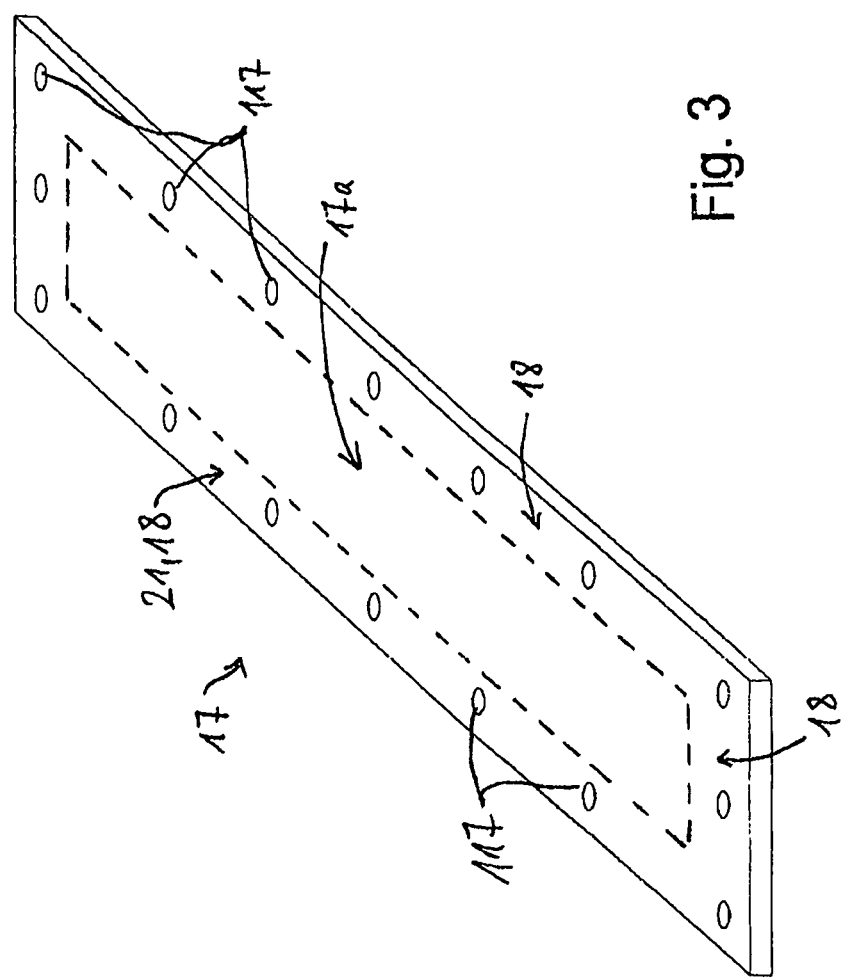

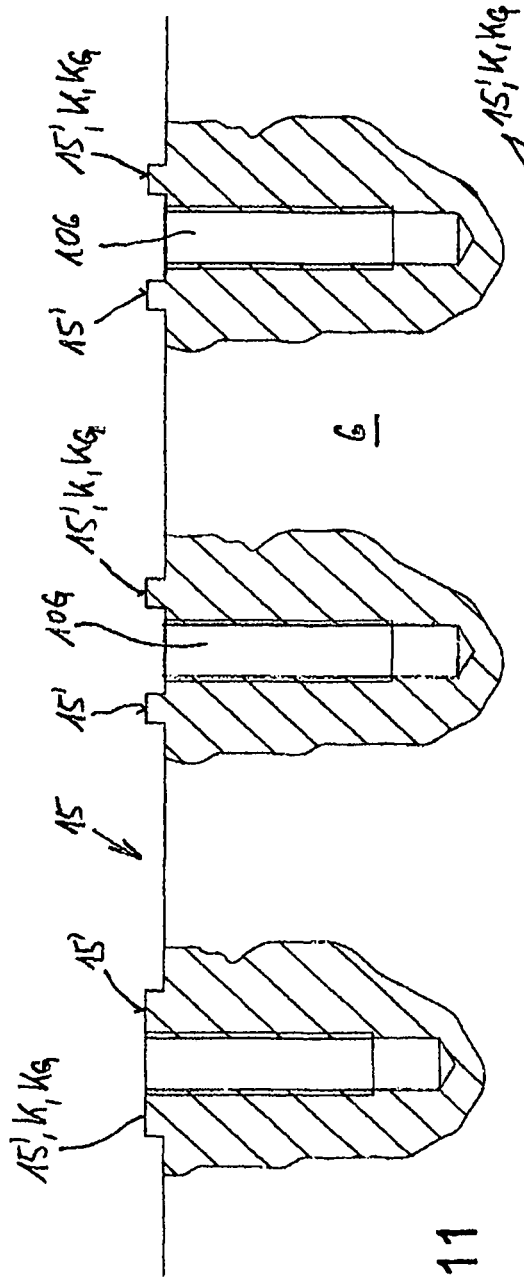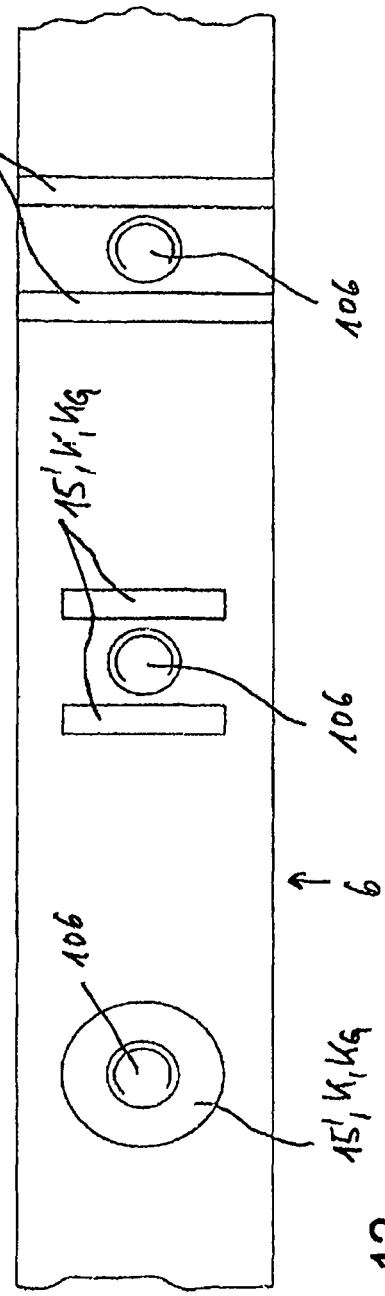

HIGH-FREQUENCY SHIELDED HOUSING, IN PARTICULAR HIGH-FREQUENCY SHIELDED FILTER HOUSING

This application is the U.S. national phase of International Application No. PCT/EP2015/000932 filed 7 May 2015, which designated the U.S. and claims priority to DE Patent Application No. 102014007927.9 filed 27 May 2014, the entire contents of each of which are hereby incorporated by reference.

The invention relates to a high-frequency-proof housing in accordance with the preamble of claim 1, in particular to a high-frequency-proof filter housing.

In communications technology, for example in radio and television broadcasting technology and in the field of mobile communication, high importance is placed on shielding, in terms of high-frequency radiation, of appliances, housings, boxes, components, or assemblies in general. For simplicity, reference is often merely made to high-frequency-proof shielding. This is intended to prevent high-frequency radiation from escaping from the region to be shielded (housing etc.) to the outside or penetrating the region to be shielded (housing etc.). These measures are intended to prevent high-frequency interfering radiation on both sides, which can cause a variety of possible effects. As well as the infiltration of undesired signal components, undesired intermodulation products may also occur. Appropriate shielding may also be used within a housing in the form of partition walls, so as to shield different circuit parts of an electronic system from one another for example.

The most frequent cause of electromagnetic interfering radiation is the deficient design of the connection between housing walls and corresponding cover parts. Small gaps, which act as slot antennae, can greatly reduce the shielding attenuation. These gaps result from poor contacts, tolerances, or irregularities or bumps in the housing walls or cover surfaces.

Therefore, screw or rivet connections also have major drawbacks if this technology is to be used to implement high-frequency shielding.

To compensate for irregularities, for example between a cover and a housing wall, and to achieve sufficient shielding, a wide range of sealing elements or contact strips for insertion have previously been used.

In particular in radio systems, such as in the field of mobile communications, filters in a wide range of configurations are often used, for example in the form of band-stop filters, band-pass filters, high-pass or low-pass filters, etc. Appropriate filters may also be in the form of duplex filters, which comprise for example a transmission branch and a receiving branch, which each lead from a different terminal to a shared antenna terminal. Suitable frequency filtering is therefore necessary to separate the transmitted and received signals.

High-frequency filters of this type are often formed in a coaxial construction, in other words as coaxial resonators.

Regardless of this construction, the corresponding resonators, in other words the filter housings, have to be formed so as to be shielded in a high-frequency-proof manner.

A high-frequency filter is known for example from WO 2006/063640 A1. This high frequency filter may consist of a plurality of resonators, which each comprise an external conductor housing, a housing base and an internal conductor which is preferably arranged coaxially with the external conductor and which generally ends at a distance below the housing cover which can be placed on the housing.

As is known, high-frequency filters of this type, also referred to as HF filters for short in the following, are made of a metal housing, usually an aluminium housing. They may for example be in the form of a milled or cast part so as to prevent intermodulation problems as a result of joints in the filter as far as possible. In addition, the housing cover is also similarly generally made of a metal, in other words a milled or cast part, for example made of aluminium, the housing cover additionally preferably being silvered to achieve good electrical contactability with the housing. In principle, it is also known that for example the housing and/or the cover may also be formed from a dielectric (plastics material). In this case, the housing or the cover must be silvered or at least coated with a metal layer so as to close off the resonator interior in a high-frequency-proof manner. In this case too, the critical point is the galvanic contact between the cover underside and the upper edge of the high-frequency filter housing.

Usually, the housing cover is provided with a series of holes on its peripheral edge, which holes are aligned with corresponding threaded holes in the housing walls of the cavity filter, such that by screwing in screws the housing cover can be rigidly attached to the actual housing so as to thus ensure high-frequency-proof mounting of the cover.

Therefore, the generic EP 2 443 694 B2 proposes using a circuit board consisting of an appropriate circuit board material as a cover for an HF-proof filter housing. The material of a circuit board of this type is at least slightly more deformable than metal. This is intended to make it possible for the cover, consisting of a circuit board and coated with an electrically conductive metalized layer on the underside thereof facing the housing, to rest as well as possible on the peripheral edge of the box-shaped housing and to rigidly abut said housing appropriately when screws are screwed in. This is meant to ensure that as few intermodulation problems as possible occur. Alternatively, a cover of this type may also be soldered to the housing so as completely to prevent any gaps.

Since the filter housing is thus always sealed with a cover, this requires planar cover placement and defined contact pressures because of the intermodulation requirements in particular in mobile communications. To achieve this, a very large number of screws/contact points is necessary. The screws have to be positioned at the defined (not too large) distance. This is because of the high frequency of signals at which the filter operates. An appropriately close sequence of screw connections for fastening the cover to the high-frequency filter housing should be ensured, and it should also be ensured that there is no gap between the cover and the screws.

Merely for completeness, in relation to the configuration of a filter arrangement comprising a plurality of resonators, reference should also be made by way of example to WO 88/01104 A1, which comprises a dielectric block that has a cover arrangement spanning said dielectric block and has, on its outer longitudinal faces, resiliently biased tongues spaced apart from one another. These tongues are thus intended to abut the outer face of the dielectric block, which is provided with an electrically conductive surface. Galvanic contacting is intended to be implemented as a result, but poses major problems as regards an intermodulation-proof arrangement, since it is not possible to establish precisely reproducible conditions.

US 2013/0322021 A1 also discloses an HF-proof housing. This housing is initially intended to comprise openings between the peripheral housing edge and the cover in order, for example, to dissipate heat from the inside to the exterior at these points. For this purpose, projections that are offset in the peripheral direction of the housing edge and formed on the cover underside are proposed, by means of which the cover thus rests on the end face edge of the housing at offset points. A hole is then provided in the middle of the cover between two such projections for fastening the cover to the housing walls at these points by means of screws. In the process, the screws can be tightened such that the housing cover also abuts the end faces of the planar peripheral housing wall in the region of the screws.

In an alternative embodiment, the corresponding offset projections can also be formed on the peripheral end face edge of the housing. If a planar cover is placed thereon, it contacts these projections. The screws are likewise screwed into the housing walls again through holes in the cover, meaning that in this variant too the housing cover necessarily has to be bent accordingly towards the peripheral end face of the housing wall. Contact points at which the screws are tightly screwed in are thus always produced in the region between the cover and housing wall. Further contact points are formed at each raised projection between the housing cover and the end face of the housing wall.

A shielded housing is generally known from the prior publication U.S. Pat. No. 6,307,449 B1. The housing has a peripheral smooth edge, on which a housing cover is mounted and fastened in the corners by means of screws. In order to connect a circuit board, a suitably large recess can be provided in a side wall of the housing, through which recess a substrate, for example in the form of a circuit board, can protrude from the side of the housing. However, owing to the large openings, a housing of this kind can no longer be described as being electromagnetic radiation-proof or high-frequency electromagnetic radiation-proof.

Auxiliary means such as contact strips are known for producing a high-frequency-proof housing are generally also known from EP 0 952 765 A2, which proposes a specific contact strip that has a plurality of oblique contact fingers. A contact strip of this kind can then be placed in corresponding recesses between the housing and housing cover in order to enable a contact sequence that is as tight as possible between the housing cover and housing with the aim of making the housing high-frequency-proof.

In view of this, the object of the present invention is to provide an improved HF-proof housing and in particular an HF-proof filter housing which, in addition to the actual, generally box-shaped housing, comprises a cover which is rigidly connected to the filter housing by means of screw connections on the peripheral edge of the housing. The arrangement should be such that a high-frequency connection which prevents intermodulation problems or reduces them to a minimal, tolerable fraction is provided in as simple a manner as possible.

The object is achieved according to the invention by the features set out in claim 1. Advantageous embodiments of the invention are set out in the dependent claims.

In the context of the invention, a surprisingly simple solution is provided for a high-frequency-proof housing, and in particular a high-frequency-proof filter housing, which additionally significantly reduces intermodulation problems or even completely prevents them.

In the context of the invention, first housing edge portions, each arranged or formed in relation to second housing edge portions, are provided or formed on the upper peripheral edge of the housing, which usually comes into contact with the cover underside of a cover to be placed thereon. Alternatively or additionally, first housing cover edge portions and second housing cover edge portions offset therefrom in the peripheral direction are provided or formed on the housing cover underside. Likewise, first housing cover edge portions and second housing cover edge portions offset therefrom in the peripheral direction are provided or formed on the housing cover underside. In the mounted position, the housing cover rests on the housing, the first housing edge portions of the housing coming into electrogalvanic contact the first housing cover edge portions of the housing cover, whilst the second housing edge portions and/or housing cover edge portions are formed such that galvanic isolation is produced between the housing and the housing cover here, in other words the housing edge portions and the housing cover edge portions are positioned adjacently without electrical contact.

The screw connections are provided in the regions in which the housing edge portions of the housing edge and/or of the housing cover are in mechanical contact and are electrogalvanically contacted with one another in this bearing and contact region. This ensures that the housing cover is rigidly connected to the housing by tightening the aforementioned screws exclusively in this contact region. By means of the high contact forces generated by the screws, precisely reproducible electrogalvanic contact between the housing cover and the housing is produced, making it possible to prevent or greatly reduce intermodulations.

In the regions where the screw connections are not provided, the relevant portions of the housing cover and of the housing edge then rest adjacently to one another without contact, forming a galvanic isolation region, such that galvanic contact is prevented here.

As a result, the aforementioned high-frequency-proof filter housing can be implemented whilst preventing or maximally suppressing undesired intermodulations.

The invention thus proposes forming, for example, electrically conductive contact portions that are mutually offset on the housing edge and on which the likewise electrically conductive housing cover then rests, such that electrogalvanic contact is only established in the region of the electrically conductive contact portions. Electrically non-conductive isolation regions, in other words without galvanic contact, should then be formed for example on the housing edge or on the housing cover underside between the electrically conductive contact portions.

Conversely, mutually offset contact portions may also be formed on the cover, by which portions the housing cover then rests on the electrically conductive housing edge, where it forms galvanic contact points between which isolation regions without galvanic contact are in turn formed.

Likewise, on the housing edge on the one hand and on the cover on the other hand, mutually offset electrically conductive contact portions can be formed, between which electrical isolation points are preferably provided in each case or formed at the latest when the cover is placed on the housing. If the electrically conductive contact portions, formed on the housing cover on the one hand and on the housing edge on the other hand, come into contact in a completely or partly overlapping manner as a result of the cover being placed on the housing, the galvanic contact regions, between which electrogalvanic isolation regions, in other words regions without contact, are produced, are formed in this overlapping contact region.

In all these cases, the screw connections are only provided in the regions in which the electrogalvanic contact regions are formed, such that the precisely reproducible electrical contact conditions which prevent or greatly reduce the undesired intermodulations are established here as a result of the high contact forces.

In a preferred embodiment, for this purpose both the peripheral edge of the (box-shaped) housing facing the cover and the edge of the cover mounted thereon have defined contact surfaces in the region of the screws, and a gap is formed between the surfaces of the peripheral edges of the housing and cover that are to rest on top of one another, in the intermediate region between two successive screws. In other words, between the screws, undefined cover placement is prevented in this case by forming a potentially extremely small gap.

As stated, in the context of the invention, the screw connections are located in a fastening region, which is distinguished by raised housing edge portions and/or raised housing cover edge portions. However, these raised portions need not be fully closed around the corresponding hole for passing the screw through. It is also possible for these raised portions to be discoid for example. It is also possible for example for the raised portions to be in the form of two ridges which extend in parallel and between which the hole for screwing in the fastening screw is provided. These ridges may not only extend in parallel with the corresponding housing wall, but preferably transversely or perpendicularly thereto. They need not even extend over the entire width of the wall. Shorter sizing is sufficient adjacent to the hole positioned therebetween.

It has further been found to be particularly favourable if the raised portions do not end angularly or square with respect to the bearing surface, but are instead provided with roundings, for example bead-shaped roundings, etc.

The solution according to the invention thus ensures that the contact points on the screw fastenings are precisely defined and at the same time can have a very high contact pressure applied to them, since the contact forces between the cover and the bearing contact and pressure surfaces of the peripheral edge of the housing can only act here. By forming isolation portions, for example in the form of potentially very small gaps or spacings in regions between two adjacent screw fastenings, the cover is prevented from being placed down in this area. As a result of the corresponding spacing sequence of the screws, a configuration of this type is simultaneously high-frequency-proof. The configuration of the filter housing is thus extremely simple, since at critical points, including the corners, the cover no longer has to be placed on in a planar manner. In the context of the invention, the filter properties, such as attenuation, VSWR, etc. can be achieved comparably, i.e. in particular in a precisely reproducible manner. This is surprising because in structures as resonant as a filter it would be assumed that each opening would have a major effect on the stated electrical properties.

In modified embodiments of the invention, the advantages according to the invention are achieved in that, by way of suitable measures, electrogalvanic contacting between the housing cover and the housing (specifically screw fasteners passing through in the region of these portions) is only established at the desired portions, whilst electrical contacting between the cover and the housing is prevented in the portions between the screw connections.

This can be achieved for example by using a housing cover which is formed of a dielectric, in particular in the form of a circuit board. The circuit board is provided with a metalized layer. On the underside of the housing cover, a metalized layer is omitted or removed in each region between two screw connections, such that the dielectric located underneath is exposed towards the housing. The region of the missing or removed galvanisation on the housing cover underside is preferably omitted in a wider portion, wider than the bearing portion of the housing wall of the housing underneath, such that electrical contacting between the housing cover and the corresponding surface portions of the housing wall is not possible in this region.

However, it is also equally possible for example for the housing, which is usually box-shaped or box-like, to consist for example of a dielectric (for example a plastics material such as circuit board material) and to be coated with an electrically conductive layer on its inner and outer surfaces, including the upper surface which usually contacts the cover underside, and for the metallization of the corresponding surface portions not to be formed and/or to be removed on the housing edge which is usually electrical contacted with the cover underside, such that a galvanic isolation point is formed here between two successive screw connections. In this variant, the metallization is preferably also omitted, at least to a small vertical extent, on the inner face and outer face of a corresponding housing wall so that the metalized inner and/or outer faces of the housing and the galvanised inner face of the cover cannot be accidentally galvanically contacted here either.

Naturally, at each corresponding point on both the cover underside and the peripheral housing edge, corresponding portions may be formed together without a corresponding metalized layer.

Conversely, at the desired points between two screw connections, preferably very thin insulating layers can in principle be formed on the cover underside or on the housing and in particular on the peripheral housing edge, so as to otherwise prevent and suppress the galvanic contacting between the cover and the housing.

Generally, the invention as a whole can be characterised as follows:

a plurality of mutually offset contact portions are formed or provided between the housing cover and the housing, galvanic isolation portions, in the regions of which the housing cover and the housing are galvanically isolated, are provided between the contact portions, and the screw connections are provided in the contact portions in the regions of which the housing cover is galvanically contacted with the housing.

In the following, the invention will be described in greater detail by way of drawings, in which specifically:

FIG. 3 is a three-dimensional drawing of a housing cover for sealing the open part, shown in FIG. 1, of the complete housing;

Figure 2:
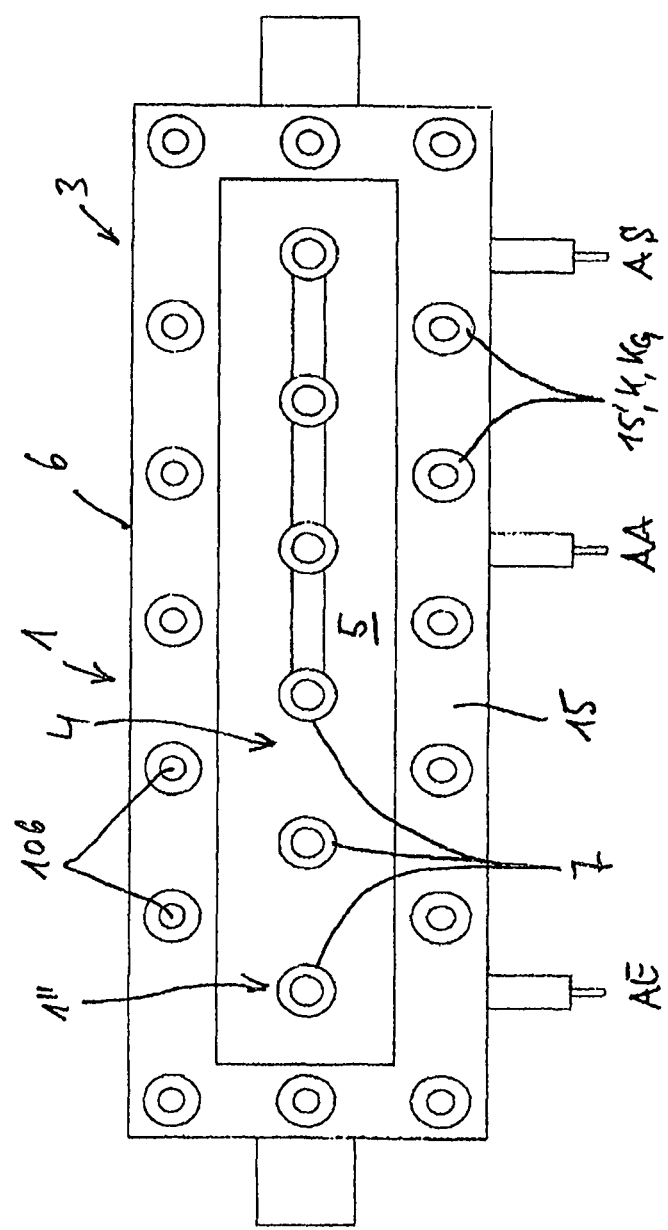
FIG. 2 is a plan view of the open housing shown in a side view in FIG. 1.
Figure 5:
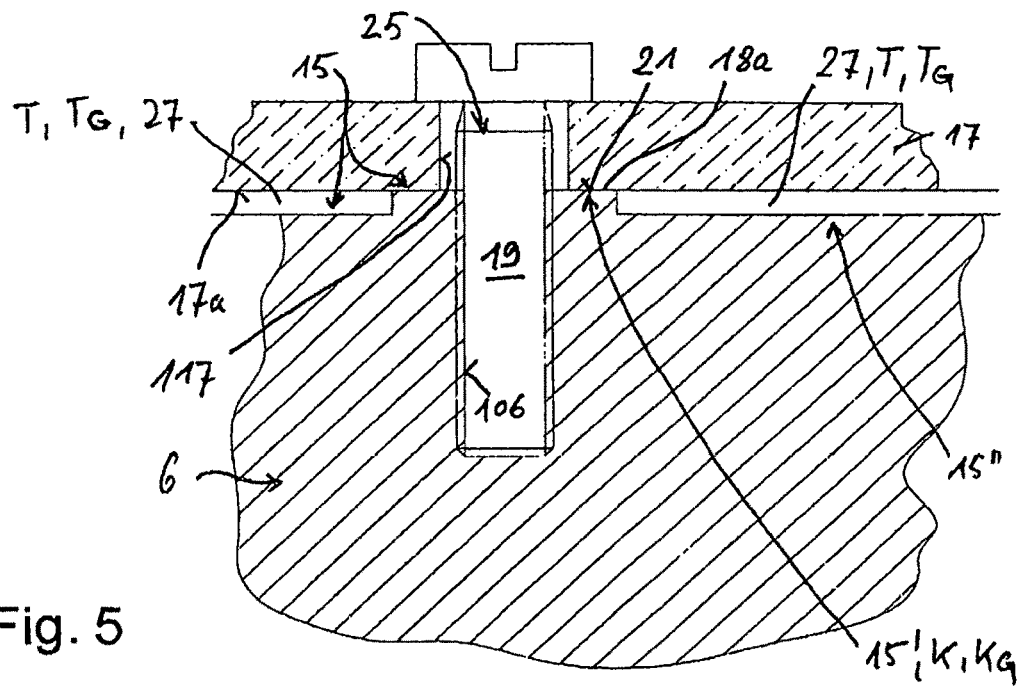
FIG. 5 is a schematic side view of the detail A shown in FIG. 3.
Figure 8:
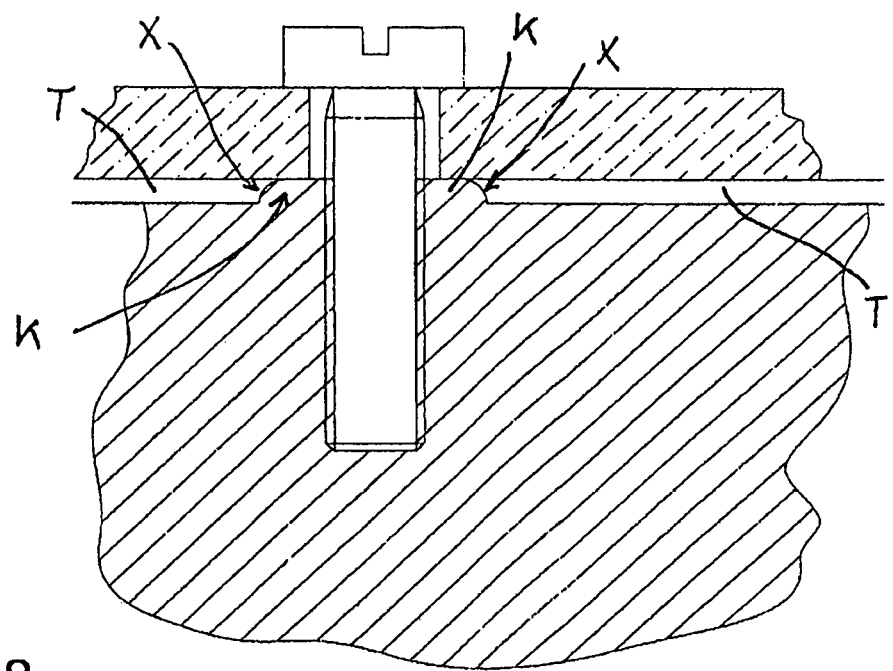
Figure 10:
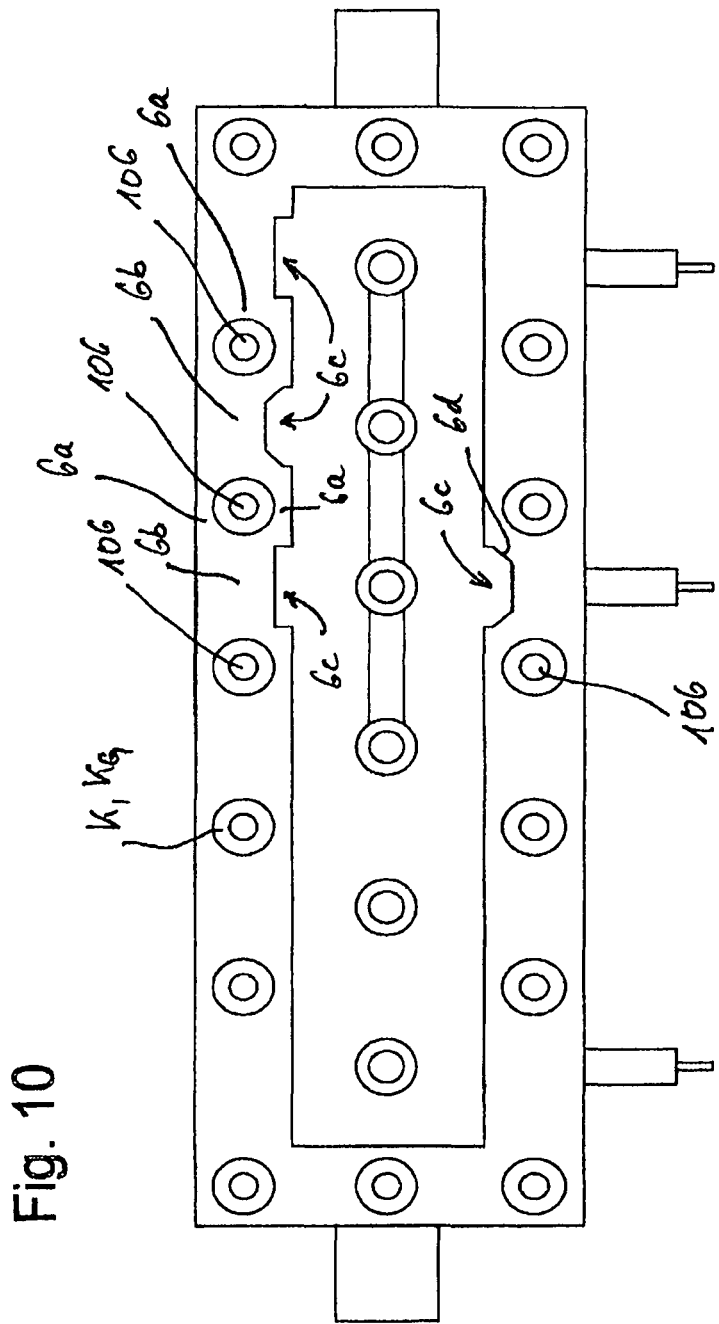
Figure 13:
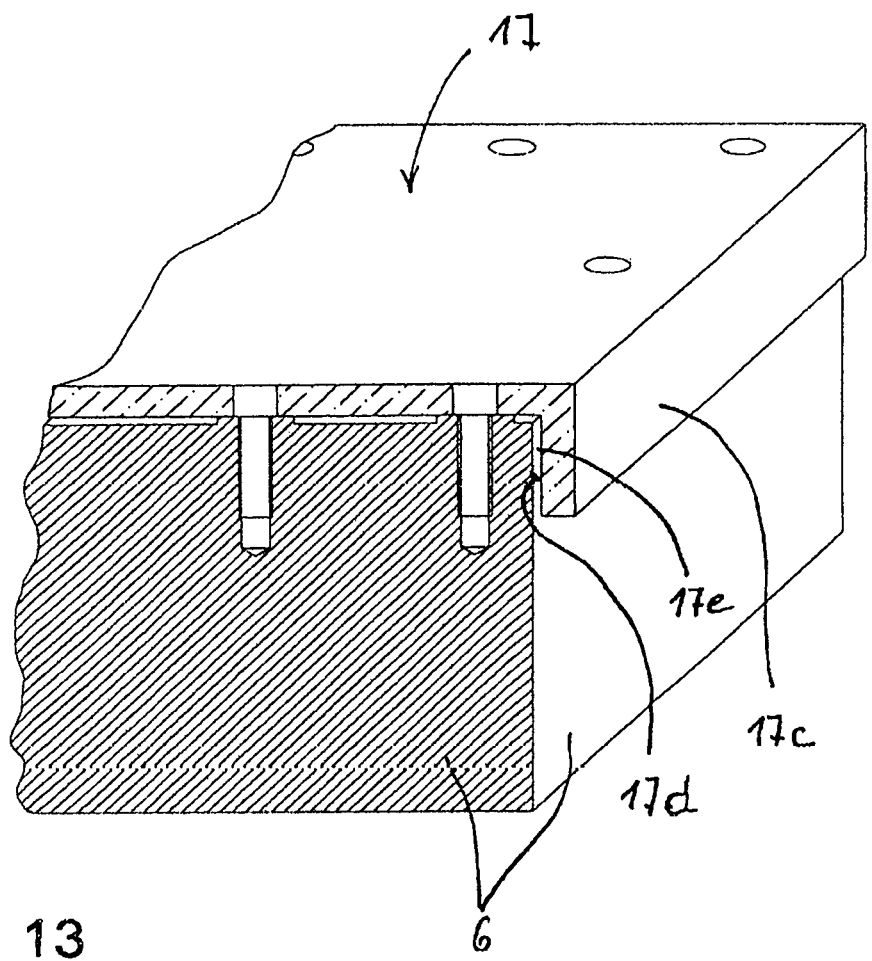
Figure 14:
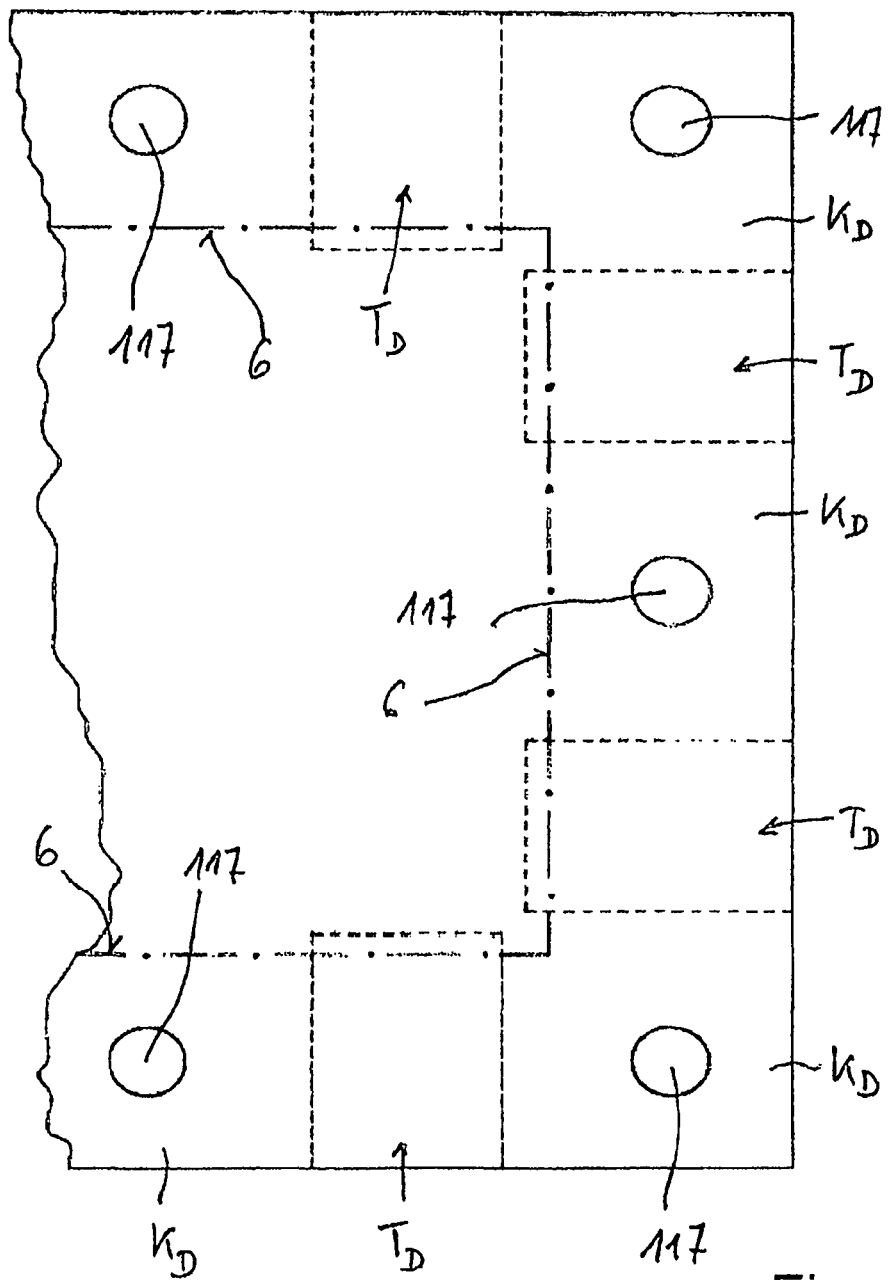
Figure 15:
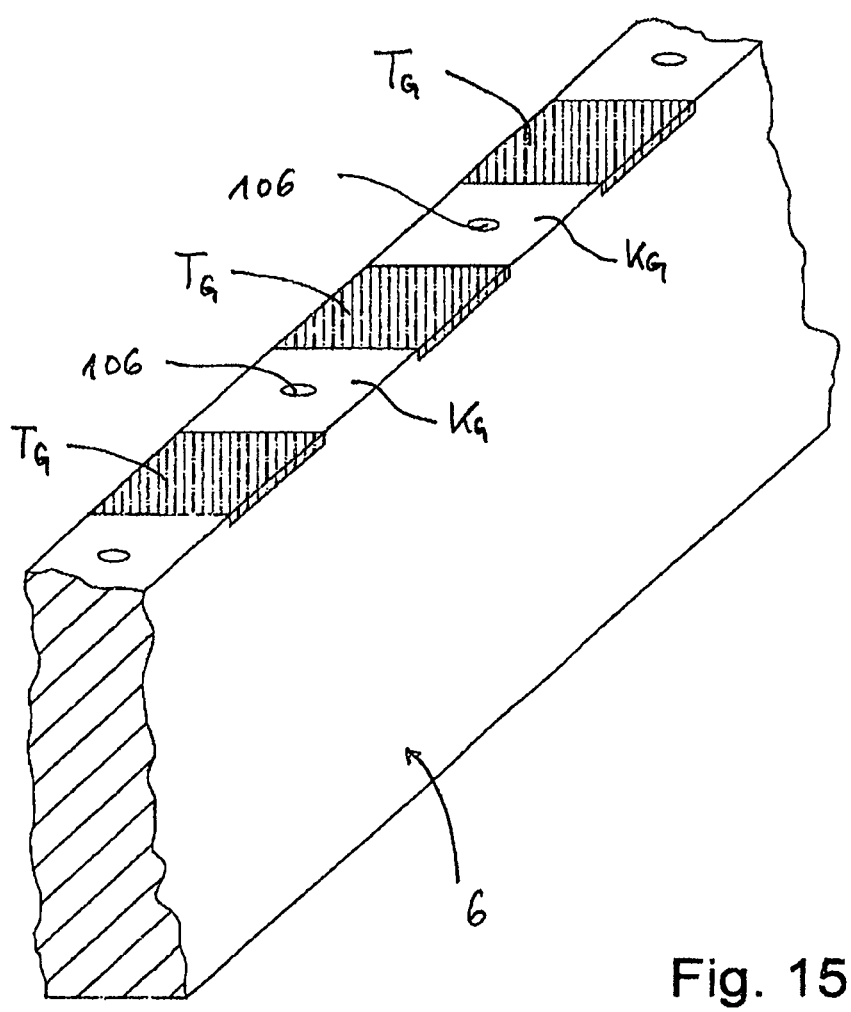

FIG. 7 again shows a slightly modified embodiment in a side detail comparable to FIG. 5;

FIG. 8 is an embodiment slightly modified from FIG. 5 having rounded edges;

FIG. 9 again shows an embodiment slightly modified from FIGS. 5 and 8 having double-sided rounded edges;

FIG. 10 is a plan view of an embodiment modified from FIG. 2, in which the walls of the housing have a greater thickness in the region of the hole than portions therebetween;

FIG. 11 is a vertical sectional drawing in the longitudinal direction through a housing wall, showing three modifications forming raised housing edge portions;

FIG. 12 is a corresponding plan view of the embodiments according to FIG. 11;

FIG. 13 is another slightly modified embodiment having a cover provided with a peripheral edge;

FIG. 14 is a partial view from below of the housing cover in relation to a modified embodiment of the invention; and FIG. 15 is a partial perspective view of a portion of the housing wall in relation to another modified embodiment of the invention.

FIGS. 1 to 5 show a first embodiment of a high-frequency-proof housing according to the invention preventing intermodulation problems, in particular in the form of a filter consisting of coaxial resonators. These filters are also known as coaxial cavity filters, which may in principle be in the form of band-pass filters, band-stop filters, etc. In the present case, the filter may for example be used as a duplex switch, such as are required in mobile communications technology.

In the embodiment shown, the coaxial cavity filter 1 (sometimes also simply referred to as a cavity filter or coax filter 1 in the following) comprises a chest-shaped complete housing 2, which is open on at least one face (in this case upwards). This open face OS is sealed by a cover 17 (see FIG. 3) for operation of the coax filter. The housing 2 further has a base 5, a peripheral housing wall 6 and internal conductors 7 that are provided in the interior 4 thus formed and extend vertically from the base 5 over part of the height of the housing 3.

Figure 1:
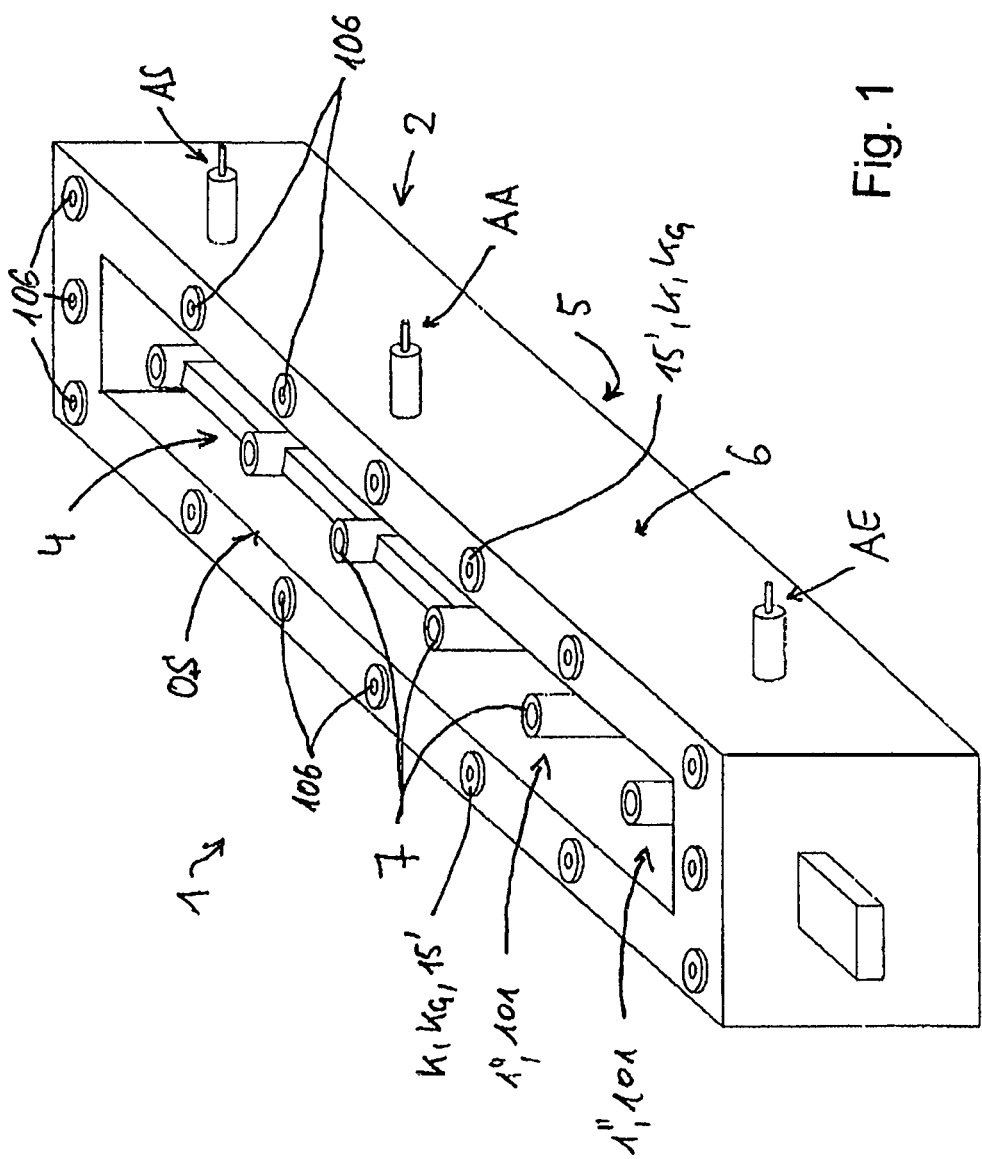
FIG. 1 is a schematic three-dimensional drawing of an open housing of a complete HF-proof housing without the cover.
Figure 2A:
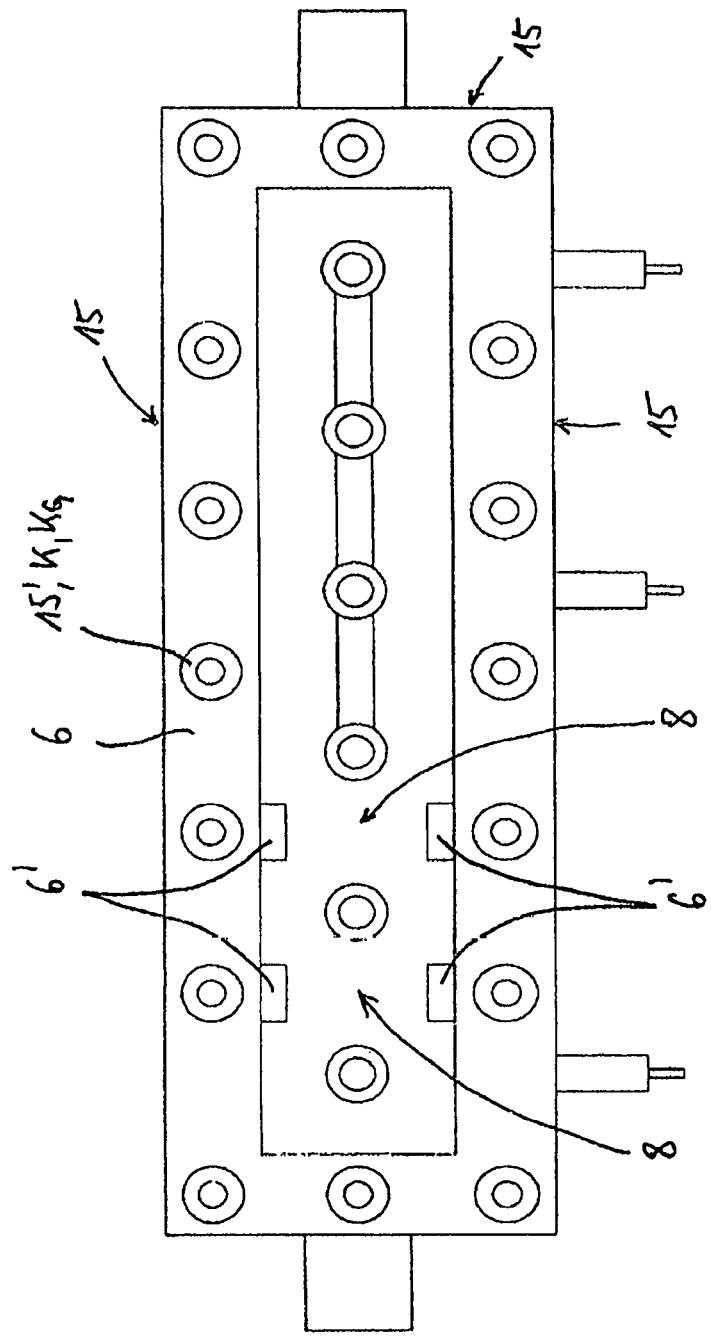
FIG. 2a is a drawing slightly modified from FIG. 2, illustrating that the individual chambers of the resonators can also be subdivided by forming apertures using boundary walls.

The cavity filter shown in FIG. 1 and FIG. 2 (with the cover omitted in these drawings) is generally subdivided into chambers 101, which are defined by boundary walls, it being possible for the boundary walls each to be formed of for example two wall portions 6' protruding inwards from the housing wall 6, as is shown in FIG. 2a. Likewise, in many cases it may be sufficient for a corresponding wall portion 6' to only protrude from one inner housing wall. In both cases, in effect apertures or windows 8 are formed in between either the wall portions 6' which only protrude inwards in part or the single wall portion which protrudes inward on the opposite inner housing wall, it being possible to couple the individual coaxial resonators 1" to one another via these apertures or windows 8.

In the region of provided terminals, suitable measures for coupling the signals in and out are provided in each coax filter 1", reference being made to known solutions in this regard. At the provided input or output terminals AE, AA, AS, otherwise conventional coaxial plugs can be connected to corresponding line connections.

The chest-shaped housing 3 thus constructed, comprising the housing base 5 and the internal conductor 7, may be formed from a metal milled or cast part. Preferably, aluminium is used for this purpose.

In principle, it is noted that the invention may also be implemented using a housing 3 and/or a housing cover 17 (FIG. 3) which consists of a dielectric material (in particular plastics material). In this case, the housing 3, in other words the housing wall 6, the housing base 5, the internal conductor 7 and the housing cover 17, would have to be coated with an electrically conductive layer, generally a metal layer. In this case, above all the inner walls and inner surfaces of the housing 3 have to be coated with the electrically conductive layer (which thus faces the interior), including the peripheral housing edge 15. As for the housing cover 17, the housing cover underside 17a facing the interior has to be coated with an electrically conductive layer, such that not only mechanical but also galvanic contacting is possible in the edge region 18.

Figure 4:
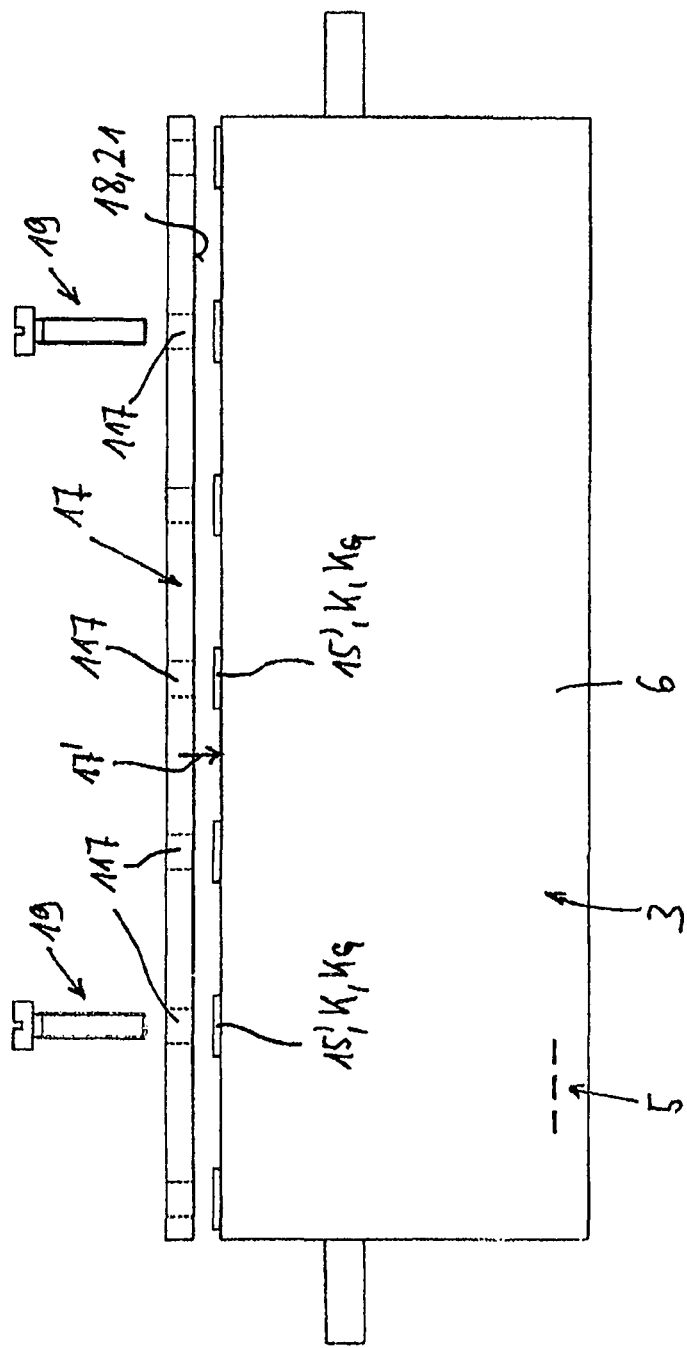
FIG. 4 is a schematic side view of the open housing shown in FIG. 1.

A housing cover 17 is positioned on the peripheral housing edge 15, facing away from the base 5, of the housing 3, and rigidly screwed to the housing 3 by means of a plurality of screw connections 25, in this case in the form of screws 19. In FIG. 4, the housing 17 or partial housing 3, the aforementioned housing cover 17 and some of the fastening screws 19 are arranged above one another in the manner of an exploded view. By means of an arrow 17', it is further shown that the housing cover 17 is positioned on the peripheral edge 15 of the (open) housing 3, and the housing cover 17 is subsequently fastened. For this purpose, the fastening screws 19 are placed through a corresponding number of fastening holes 117 (formed in the housing cover edge 18) and screwed flush into the provided threaded holes 106 of the housing wall 15, as discussed in greater detail below.

So as to shield the individual coaxial resonators 1", in other words the interior 4 of the high-frequency cavity filter 1, towards the outside in an HF-proof manner and to prevent intermodulations, it is provided in a first embodiment, with reference to the aforementioned FIGS. 1 to 5, for the housing cover 17 to be for example flat or planar or at least to have a flat or planar peripheral edge 18, 21 or a corresponding peripheral edge surface 18, 21.

FIG. 3 is a three-dimensional drawing of the housing cover 17, specifically from the underside 17a thereof. In other words, the peripheral housing cover edge 18 of the housing cover 17 is positioned on the upwardly open chest-shaped housing 3. This peripheral edge 18, in other words this peripheral edge surface 18, is shown in dashed lines.

The housing cover edge 18 or edge surface 18 of this housing cover 17 rests (only in part as explained in the following) on the peripheral housing edge 15.

However, as can be seen from the side view of FIG. 4 and also from the enlarged detail of FIG. 5 (which shows an enlargement of a region in FIG. 4 in vertical section), the housing edge 15 does not have a consistently high level, in other words is not flat or planar overall. FIG. 5 shows that the peripheral housing edge 15 is subdivided into individual housing edge portions, specifically housing edge portions 15' that are raised, i.e. protrude towards the housing cover 17, which are followed by depressed, in other words recessed, housing edge portions 15". FIG. 5 shows in a side view (partially in section) that the housing cover 17 is formed as a plate, such that the aforementioned planar housing cover edge 18 can only rest on the raised housing edge portions 15'. In this region, where the housing cover 17 thus rests on the raised housing edge portions 15' of the housing edge 15 by means of its corresponding portions of the edge surface 21, galvanic contact is thus produced between the underside 17a of the housing cover 17 and the raised housing edge portions 15' of the housing wall 6. Only in these regions 18a do the screwed-in screws 19 produce a corresponding contact pressure, which holds the cover 17 pressed against the chest-shaped housing 3.

Thus, in this embodiment, the raised housing edge portions 15' form housing-side contact portions or contact regions $K_G$ on the housing, which come into contact with the cover underside when the cover is mounted. The edge portion on the cover underside that comes into contact and thus into galvanic contact with the raised housing edge portions 15' thus forms cover-side contact regions or contact portions $K_D$, the cover-side contact regions or contact portions being flat without projections and without depressed portions in this embodiment. Since the housing and the housing cover consist of an electrically conductive material and/or (for example if they consist of plastics material or another dielectric) are coated with an electrically conductive layer, the aforementioned housing edge portions 15', which are raised and protrude in the mounting direction (in other words towards the housing cover), form electrogalvanic bearing and/or contact portions K, on which the housing cover rests. In this case the contact portions K are thus formed by housing contact portions $K_G$ so as to bring about the desired galvanic contacting in this region.

By contrast, the housing edge portions 15" formed on the housing and recessed or depressed with respect to the housing cover 17 form galvanic isolation points, in other words contact-free isolation regions or isolation portions T, specifically isolation regions or isolation portions $T_G$ which are contact-free with respect to the housing or housing edge. The edge portions on the cover underside which are directly adjacent thereto or come to rest above the recessed housing edge portions 15" in the assembled state, and which thus come to rest at a distance from the housing edge, thus likewise form the aforementioned isolation regions or isolation portions T, in other words specifically isolation regions or isolation portions $T_G$ which are present on the cover in these regions, even if these portions are intended to be electrically conductive. This is because housing edge portions 15" slightly spaced apart from the housing cover 17, in other words depressed portions, are then located between two housing edge portions 15' raised in this manner, such that a gap 27 is formed here between this depressed housing edge portion 15" and the underside 17a of the housing cover 17. Thus, no galvanic and mechanical contact effect can occur in this region.

As a result of the correspondingly close sequence of adjacent screw connections 25 comprising the screws 19 in accordance with the spacing sequence of the holes 106, it is nevertheless ensured that the complete housing 2 with the mounted housing cover 17 is high-frequency-proof. In other words, the gaps 27, which may only be sixed extremely small in height, are not detrimental to establishing high-frequency shielding.

Above all, it is important that the screws 19 indicated in FIG. 5 can be screwed into the threaded holes 106 in the side walls 6 through the fastening holes 117 in the housing cover 17 such that the housing cover 17 can be pressed onto the housing cover edge portions 18a, which are in contact with the raised housing edge portions 15', using above-average contact pressures. In other words, in these edge portions 18 (which rest on the correspondingly raised housing edge portions 15' of the housing 3), rigid, precisely reproducible galvanic connection having high contact pressures is ensured, specifically by the defined contact surfaces which are penetrated by the screw connections 25. These defined contact surfaces are ultimately formed by the gaps 27 provided between the contact surfaces.

Figure 6:
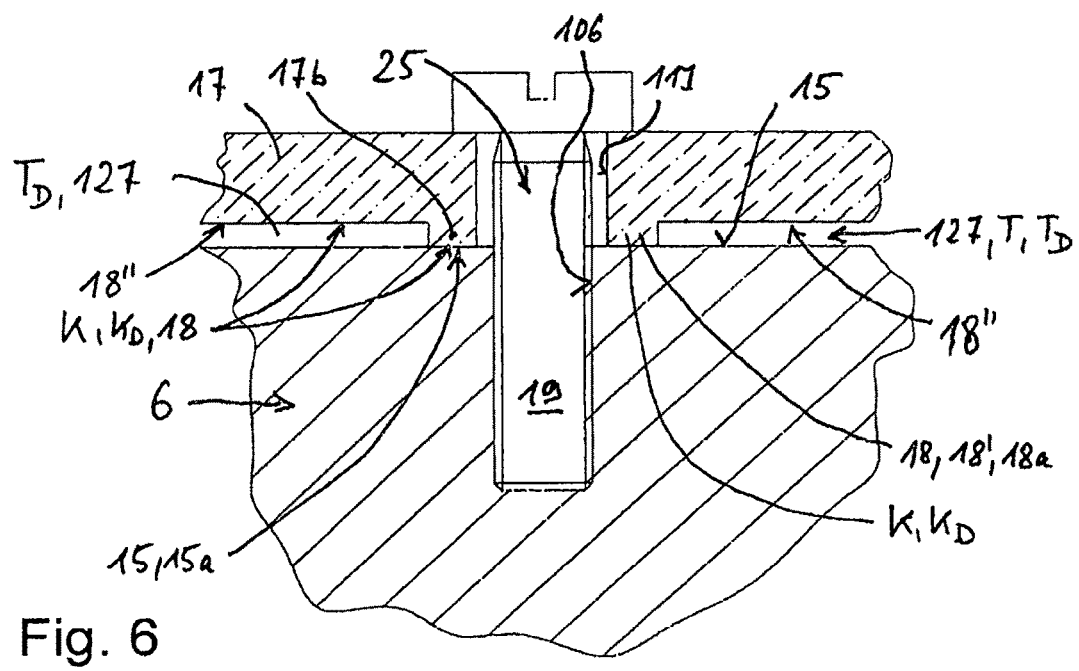
FIG. 6 is an enlarged side view of a modified cover in a partial side view.

FIG. 6 shows a reversal of the solution disclosed thus far, in which the housing cover 17 may for example have a preferably peripheral housing cover wall 17b at a low height. In this embodiment too, the peripheral housing cover edge 18, formed on the housing cover wall 17b, of the housing cover wall 17b is subdivided into different portions, specifically into raised protruding housing cover edge portions 18' (in other words protruding towards the open housing box 3) and into depressed housing cover edge portions 18' positioned somewhat further away from the adjacent housing wall 6 by comparison.

As a result, a fully comparable solution is provided, in which a housing cover 17 correspondingly mounted on the housing edge 15 can only be mounted on the peripheral housing edge 15 of the housing 3 by means of its raised protruding housing cover edge portions 18' in regions 15a (in other words only at the housing edge portions 15a which come into contact with the raised protruding bearing surfaces of the housing cover edge portions 18'). The housing cover edge portions 18", which are depressed or recessed by comparison and between which and the peripheral housing edge 15 the aforementioned gaps 127 are thus formed, are thus positioned between the raised housing cover edge portions 18'.

As a result of these gaps 127, the depressed housing cover edge portions 18" are spaced apart from the housing wall 6 of the housing 3.

In this embodiment too, the holes 117 in the housing cover 17 and the holes 106 aligned therewith in the housing wall 6 are formed at the points at which the housing cover 17 rests on the housing wall 6 of the housing 3 by its raised housing cover edge portions 18'. This also provides a good mechanical connection and additionally a good electrogalvanic connection in this region as a result of the high contact pressures of the screws 19, since defined contact surfaces are provided by forming the aforementioned gaps 127 in the region of the screw connections 25.

In the embodiment of FIG. 6 too, galvanic contact portions K, also referred to as housing cover contact portions $K_D$, are thus formed on the cover underside. If a corresponding housing cover 17 is positioned on the peripheral edge of the housing, these protruding housing cover contact portions $K_D$ come into mechanical contact with the peripheral edge of the housing and bring about electrogalvanic contacting in the contact and bearing region. The housing contact portions $K_G$ are formed in the actual contact and bearing region of the housing cover contact portions $K_D$. In these regions positioned above one another, the corresponding holes 106 for receiving the screw connections are provided, so as to be able to mechanically fasten the cover rigidly to the peripheral edge of the housing here by tightening the screws.

In the embodiment of FIG. 6, the isolation points T (also referred to herein as housing cover isolation points $T_D$) which are recessed or positioned lower than the top of the cover are provided offset from the aforementioned contact portions K. These housing cover isolation points TD are thus directly adjacent to, galvanically isolated from and thus contact-free with respect to the corresponding portions on the housing edge of the housing, these contact-free portions thus also being referred to as housing isolation regions or housing isolation portions $T_G$.

Figure 7:
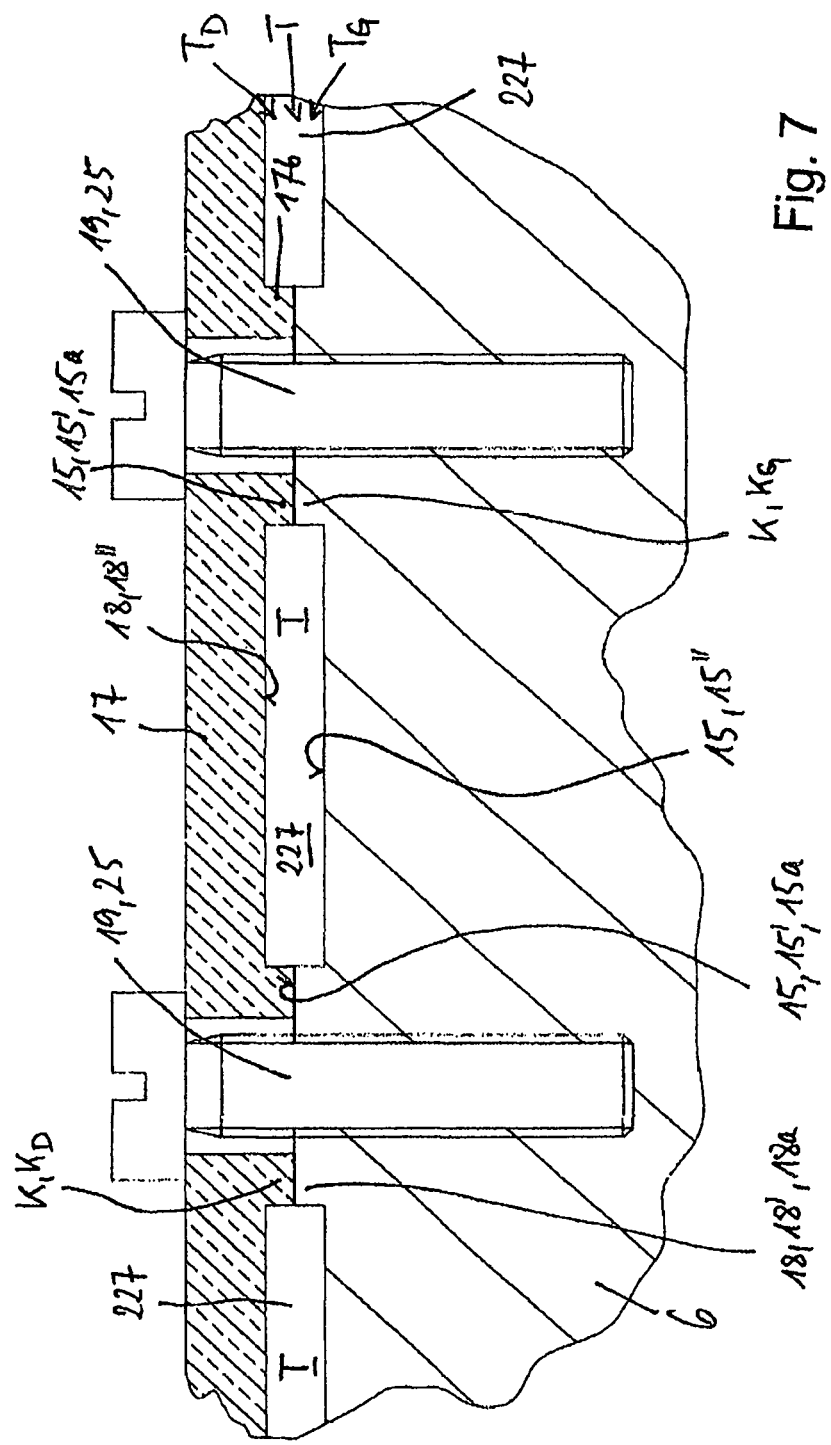

By contrast with the previous embodiments, FIG. 7 shows that the principle of FIG. 5 and the further principle as explained with reference to FIG. 6 can also be combined. In this case, therefore, the peripheral housing edge 15 has a series of steps, in other words the bearing and/or contact surfaces that protrude slightly further towards the housing cover 17 and have been defined as raised housing edge portions 15'. In addition, the housing cover 17 is also equipped with the raised housing cover edge portions 18', as has been shown in FIG. 6. The associated raised housing cover edge portions 18' thus rest on the raised housing edge portions 15' over the entire area or so as to only overlap in part. Each depressed, in other words recessed, housing cover edge portion 18" offset therefrom and the likewise depressed, in other words recessed, housing edge portions 15" thus form an intermediate gap 227 in each case. The screws 19 again penetrate the fastening holes 117 in the housing cover 17 and are screwed into an internal thread into the threaded hole 106 in the housing. The holes 117 penetrate the housing cover 17 in the raised housing cover edge portions 18' and the holes 19 are made in the region of the raised housing edge portions 15'. The arrangements and the size of the contacting surfaces on the raised housing edge portions 15' and the housing cover edge portions 18' are preferably identical, in other words preferably provided with the same surface size and at the same point, in other words in the same position, such that the associated surfaces thereof are positioned on top of one another over the whole area as far as possible. In relation to the intermodulation compatibility, it has proven particularly advantageous for the edges of the raised housing cover edge portions 18' and the raised housing edge portions 15' to be rounded or provided with a radius.

FIG. 8 therefore shows a drawing differing from FIG. 5, in which the raised housing edge portions 15' are positioned at a distance from the associated screws 19, and are provided, adjacently to the underside 17a of the cover 17, with an edge X which is rounded in section. The radius may preferably be approximately the same height as the slot 27.

Figure 9:
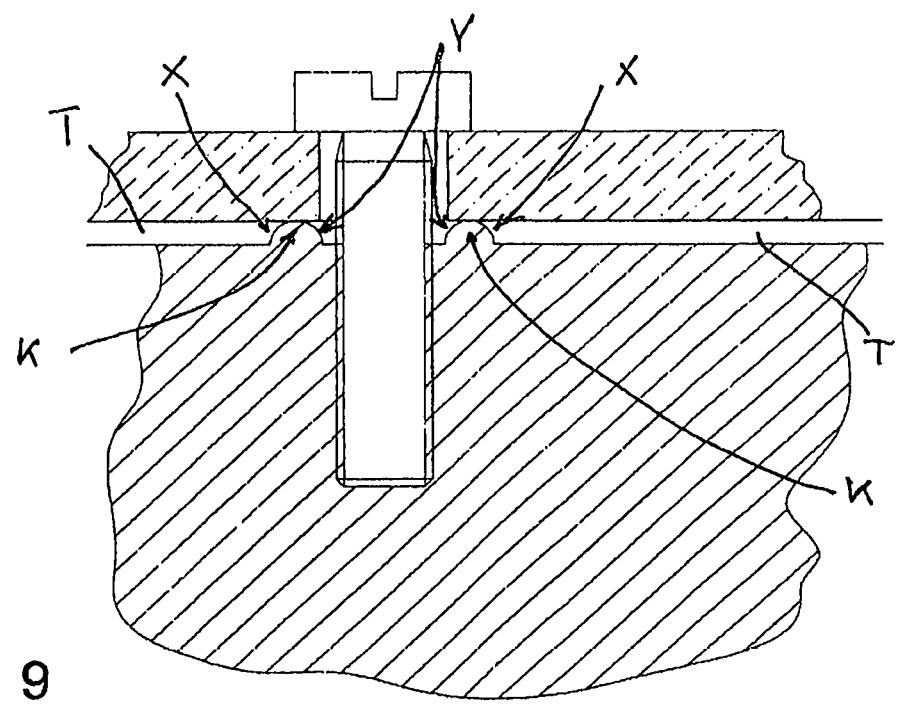

In the variant of FIG. 9, the raised housing edge portions 15' actually have rounded edges not only on the sides remote from the associated screws 19, but also on the sides facing the screws 19, in other words have a rounded edge X and have a rounded edge Y opposite. In other words, the radius of these roundings X and/or Y should be at least 10% of the height of the spacing gap 27 (or 127) in the embodiment FIG. 6 or 227 in the embodiment of FIG. 7, in particular more than 20%, 30%, 40%, 50%, 60%, 70%, 80%, 90% or 100% of the height of the spacing in question. Usually, the radius is less than or equal to the height of the spacing, in particular less than 90%, 80%, 70%, 60%, 50%, 40%, 30% or 20% of the height of the spacing gap.

It is further noted that the corresponding roundings or rounded edges X and/or Y may also be provided in the embodiments of FIG. 6, such that these roundings or rounded edges are thus formed on the raised housing cover edge portions 18', specifically again on the side remote from the screw and on the side facing the screw in each case. The same applies to the embodiment of FIG. 7, in which rounded edges could converge in each case, since they may be formed on both raised portions 15' and 18'.

In this variant too, the advantages of the invention are thus accordingly achieved.

However, the embodiment in accordance with the example in FIGS. 1 to 5 is preferred, since in this case a planar material, in particular a planar metal part, can be used as the housing cover.

As shown, the aforementioned housing walls 6 of the filter may have the same wall thickness. In the embodiment shown in accordance with FIG. 10, the housing wall is formed with a varying thickness. In each of the regions in which the threaded holes 106 are formed, the housing wall 6 has a thicker material diameter 6a so as to be able to receive the housing holes 106 at an appropriate internal diameter. The housing wall portions 6b located therebetween are formed with a thinner material portion, in other words with a thinner wall portion, by comparison. This can be implemented for example in that corresponding groove-shaped depressions 6c, which generally extend perpendicularly to the base surface and may have a suitable cross section, for example in the form of a rectangular groove or a hip-roof-shaped groove provided with opposite flattened portions 6d, are preferably formed on the inner faces of the housing walls. Any modifications are possible in this regard. Further, at these points (where the threaded holes 106 are formed in the wall portions of greater thickness), a defined contact in the form of an annular bead may be provided, which in each case forms the aforementioned raised portion 15'. In this case, the wall portions 6b located therebetween have a thinner wall thickness, as mentioned. However, this is not absolutely necessary for implementing the aforementioned embodiments.

In the following, reference is further made to a schematic modification with reference to FIG. 11 in a vertical sectional drawing parallel to the holes in the housing walls and with reference to FIG. 12 in the form of a plan view of the housing walls and/or an underside view of the edge 18, 21 of the lower housing cover.

FIG. 11 and the corresponding plan view of FIG. 11 show three slightly different variants side by side.

On the left in the embodiment of FIGS. 11 and 12, a corresponding raised housing wall portion 15' is formed, which encloses the corresponding hole 106 in the housing wall 6 in a disc shape or saucer shape, in other words is annular.

In the variant shown in the centre in FIGS. 11 and 12, the raised portion 15' is ridge-shaped, and thus has for example a rectangular basic shape (generally an n-gon) in a plan view in the embodiment shown, the two elongate rectangular raised housing edge portions 15' being orientated with their longitudinal extensions transverse and in particular perpendicular to the longitudinal extension of the housing wall. One raised ridge-shaped portion is offset to the left and the other to the right in the longitudinal direction of the housing wall, such that the corresponding hole 106 is received in the housing wall intermediately between this pair of raised ridge-shaped or rectangular housing edge portions 15'. The vertical sectional drawing is shown in the centre in FIG. 11.

The variant on the right in FIG. 12 largely corresponds to the variant in the centre of FIGS. 11 and 12, with the difference that in the variant on the right of FIGS. 11 and 12 the ridge-shaped elevations 15' extend over the entire width (thickness) of the housing wall 6, whilst the ridge-shaped elevations 15' of the variant in the centre of FIGS. 11 and 12 are only thicker over part of the width of the housing wall, but are preferably arranged symmetrically with respect to a central plane of the housing wall so that the forces introduced by the screws can act symmetrically on these raised housing edge portions 15'.

However, in a departure from the drawing, the ridge-shaped raised housing edge portions 15' could also be arranged in a manner rotated about the hole 106 in the plan view of FIG. 12, in principle at any desired angle. An arrangement in which the longitudinal extension of the individual ridge-shaped or rectangular raised housing edge portions 15' come to rest in the longitudinal direction of the associated housing wall would also be possible. Any desired modifications are possible here, in particular also as regards the surface shape of the raised housing edge portions 15', which need not necessarily be rectangular.

The variants and possibilities shown in FIGS. 11 and 12 and the discussed modifications also apply equally to raised housing cover edge portions 18'. This is because the raised housing cover edge portions 18' explained with reference to the other embodiments can equally have the rounded edges X and/or Y explained with reference to FIGS. 8 and 9, but just like the embodiments disclosed with reference to FIGS.

11 and 12 in a perforated disc shape, ridge shape, etc. There are no limitations in this regard. Thus, as a result of the discussed rounded edges X and/or Y, bead-shaped raised housing edge portions and/or housing cover edge portions are generally also possible.

In the following, reference is again made to FIG. 13, which is a drawing of a modified embodiment. In this drawing, the front side wall of the housing is shown in vertical section, specifically in a plane in which the centre of the screws comes to rest.

From this, it can be seen that the cover is not planar, but rather can be provided with a peripheral housing cover edge 17c, which may also be referred to as a peripheral housing cover flange 17c. Unlike the housing cover wall 17b explained in the other embodiments, which rests on the peripheral edge of the housing, the peripheral housing cover edge or housing cover flange 17c shown in FIG. 13 is formed such that it overlaps the housing walls, preferably externally over a partial height. The formation is preferably such that the underside or inner face 17d adjacent to the housing wall 6 is positioned at a distance from the outer wall surface of the external face of the housing wall 6, and a spacing 17e is thus formed here. As a result of the aforementioned peripheral housing cover edge or flange 17c, the aforementioned gaps 27, 127, 227 are covered towards the outside, and thus are not visible from the outside when the cover is mounted.

The spacing 17d may have a width which approximately corresponds to the size of the depth or height of the gap 27, 127, 227. The corresponding gap height 27, 127, 227 and the gap width 17d may have various dimensions. It is at least sufficiently large that galvanic contact is prevented in the relevant regions described.

In a departure from the drawings, the gap height may even take on larger values, in particular when the height of the housing cover edge or housing cover flange 17c covering the gap is even greater than the corresponding gap height.

In the following, reference is made to the embodiment of FIG. 14, which is a partial view from below of the housing cover 17.

As can be seen from this, in the region of the housing edge 18, following the housing edge in the peripheral direction, in each case a contact region or contact portion K and an isolation region or isolation portion T are provided. In this regard, reference is also made to a housing cover contact region $K_D$ and a housing isolation region $T_G$.

In this embodiment, the cover consists for example of a dielectric, in other words an electrically non-conductive body, and is preferably coated on the outer face and the inner face or underside thereof and on the peripheral end-face edge thereof connecting the top and the underside, preferably with a metal layer. This metal conductive layer is also formed in the aforementioned housing cover contact regions $K_D$. In this case, the holes 117 in the housing cover 17 are also provided in these regions.

In this case, an electrically conductive layer is removed from the housing cover isolation regions or separating portions $T_D$ such that in this region the dielectric or another insulating layer is exposed, and is thus possibly only covered by the metal layer on the outer face of the housing cover formed of an electrically non-conductive material.

If a housing cover of this type is placed on a corresponding housing, for example by way of a peripheral housing edge 15 of a housing wall 6 (shown in chain-dotted lines in FIG. 14), which edge may for example be coated over the entire surface with an electrically conductive layer (it also being possible for the housing wall as a whole, including the edge thereof, to consist of an electrically conductive material), contact points $K_G$ and electrical isolation points $T_G$ are also formed in succession on the housing wall in each case. The contact points $K_G$ on the housing edge 15 are formed by the electrically conductive contact portions KG of the housing cover resting here, in other words creating the galvanic contacting here. The screw connections are thus provided in this region. Even if the housing edge 15 is electrically conductive, the electrical isolation points $T_G$ on the housing edge 15 are formed by regions free of an electrically conductive layer being formed adjacently on the housing cover for this purpose, in particular on the housing cover underside. Contact-free regions in which galvanic contact is not provided and is not possible are thus formed here.

The principle may also be implemented in reverse. For example, it is possible for the housing 3 to likewise consist of a dielectric or generally non-conductive material or plastics material, for example of a circuit board material, the housing 3 being coated with an electrically conductive layer on its inner face and preferably also on its outer face, as well as on its upper housing edge 15 facing the housing cover 17, including the housing contact portions $K_G$. To form the housing isolation points $T_G$, between these portions the dielectric wall portions, i.e. the portions consisting of non-conductive materials, may additionally be freed of an electrically conductive layer or an electrically conductive layer of this type may not be present there ex works. On a housing edge formed in this manner, it is possible to mount a housing cover which may be conductive over the entire surface on the peripheral edge region thereof mounted on the housing edge, in other words which has an electrically conductive layer extending around in a single plane. This is because galvanically effective contact portions K are only formed where the contact portions $K_G$ provided on the housing edge come into mechanical contact when the housing cover is placed on. Where the electrically conductive layers are removed on the housing edge and the electrically non-conductive material is exposed, the isolation portions T effective between the housing cover and the housing are formed, in other words the contact-free portions in which galvanic contacting is reliably prevented. This example is schematically illustrated by way of FIG. 15.

In this last case, it is also advantageous to expose the isolation point $T_G$ on the housing edge 15, which point has been freed of an electrically conductive layer, not only on the side of the housing edge 15 facing the cover, but also additionally at least to a minimal height on the inner and outer side walls 6S.

The principle illustrated by way of FIGS. 14 and 15 can also be implemented simultaneously. In this case, the position and size of the contact points K, in other words the contact portions $K_D$ on the housing cover and $K_G$ on the housing edge, as well as the isolation points T, i.e. the cover-side isolation points $T_D$ as well as the housing-side isolation points $T_G$ on the housing edge, should preferably be tailored to one another in terms of their position relative to one another and in terms of the extension size thereof such that the contact points $K_D$ on the housing cover 17 come to rest congruently or at least so as to overlap the electrically conductive contact portions $K_G$ on the housing 3, in other words come to rest on the housing edge 15. This also ensures that the corresponding isolation points $T_D$, like the isolation points $T_G$, come to rest adjacent one another between the protruding contact portions in each case. In terms of its functional configuration, this embodiment thus corresponds to the embodiment of FIG. 7. By contrast, the aforementioned variant in accordance with FIG. 14 corresponds in functional terms to the embodiment of FIG. 6, whilst the embodiment of FIG. 15 is comparable in functional terms to the embodiment of FIG. 5.

Finally, it should also further be mentioned that it would in principle be possible, at the desired isolation points between the spacings at which the screw connections are formed, to convert an existing electrically conductive contact layer into a galvanic isolation region or isolation portion by applying an insulating film or an insulating layer. These isolation layers may be formed both as a cover underside at the corresponding points and on the peripheral edge of the housing, potentially including a side wall portion 6s. This isolation layer can be implemented both on the cover and on the housing edge.

The preferred length of the gap or the preferred length of the defined contacts between the housing cover and the housing is preferably dependent on the operating frequency for which the housing is used. Preferably, the gap length or the contact length should be less than A and in particular less than λ/2 for the average operating frequency. Preferably, the corresponding values for the gap length and the contact length are less than λ/3, λ/4, λ/5, λ/6, λ/7, λ/8, λ/9, λ/10 and smaller for the average operating frequency.

Conversely, the gap length in question should preferably be greater than 1/40 or in particular greater than 1/30 of the wavelength of the average operating frequency. The preferred values for the contact length are greater than 1/80 or in particular greater than 1/70 of the wavelength of the average operating frequency. The preferred threshold values for the gap length and the contact length can be derived from the two tables below. The final column sets out preferred individual values for the gap length and the contact length for the specified band ranges.

| Gap length | | | | | | |
|---|---|---|---|---|---|---|
| Band MHz | Average operating frequency MHz | λ mm | λ/2 mm | λ/40 mm | λ/30 mm | Actual mm |
| 700/800 | 750 | 400 | 200 | 10 | 13.3 | 24 |
| 800/900 | 800 | 375 | 188 | 9.4 | 12.5 | 24 |
| 1800/2200 | 2000 | 150 | 75 | 3.75 | 5 | 12 |

| Contact length | | | | | | |
|---|---|---|---|---|---|---|
| Band MHz | Average operating frequency MHz | λ mm | λ/2 mm | λ/80 mm | λ/70 mm | Actual mm |
| 700/800 | 750 | 400 | 200 | 5 | 5.7 | 5 |
| 800/900 | 800 | 375 | 188 | 4.7 | 5.4 | 5 |
| 1800/2200 | 2000 | 150 | 75 | 1.9 | 2.1 | 5 |

The invention claimed is:

1. A high-frequency-proof housing, comprising:
a housing comprising a housing base and a housing wall rising from the housing base,
a housing cover positioned on a housing edge formed on the housing wall of the housing to form a complete housing,
the housing and/or the housing cover consisting of an electrically conductive material or of a dielectric material coated with an electrically conductive layer,
the housing cover having a plurality of fastening holes which are aligned with corresponding holes in the housing wall,
the housing cover being fastened or fastenable to the housing by a plurality of screw connections, the screw connections comprising fastening screws which penetrate the plurality of fastening holes in the housing cover and engage in the holes axially aligned therewith in the housing wall of the housing,
the housing cover and the housing being galvanically contacted in a mounted state,
a plurality of contact portions arranged in a mutually offset manner formed or provided between the housing cover and the housing,
isolation portions formed or provided in regions of which the housing cover and the housing are galvanically isolated between the plurality of contact portions,
the plurality of contact portions being formed on the housing edge of the housing and comprising mutually offset housing contact portions which are positioned in succession and first portions of said housing edge protruding towards the housing cover,
the isolation portions comprising housing isolation portions which include second portions of said housing edge that are depressed or recessed with respect to the housing cover and are arranged between the protruding first portions of said housing edge,
a gap which provides galvanic isolation between the housing wall and the housing cover in regions of the depressed or recessed second portions of said housing edge,
the plurality of screw connections being provided in the plurality of contact portions in regions of which the housing cover is galvanically contacted with the housing,
the housing cover being rigidly connected to the housing by the plurality of screw connections only in the plurality of contact portions, and
wherein portions of said housing cover protrude towards the housing with depressed or recessed portions of said housing cover positioned therebetween; and when the housing cover is positioned on the housing, the protruding portions of said housing cover and the protruding first portions of said housing edge are positioned on top of one another in an overlapping manner at least in part, and are galvanically contacted with one another while said isolation portions are provided between the recessed or depressed second portions of said housing edge and said portions of said housing cover, thereby, forming the gap.

2. The high-frequency-proof housing according to claim 1, wherein the plurality of contact portions are square, rectangular, ridge-shaped or n-gon-shaped.

3. The high-frequency-proof housing according to claim 2, wherein the plurality of contact portions and/or the protruding portions of said housing cover are provided with corners or edges which are rounded.

4. The high-frequency-proof housing according to claim 1, wherein the high-frequency-proof housing forms a high-frequency-proof filter housing or a coaxial cavity resonator.

5. The high-frequency-proof housing according to claim 1, wherein a height of the gap is less than 2 times a thickness of the housing cover.

6. The high-frequency-proof housing according to claim 1, wherein the gap is filled with an electrically non-conductive material or dielectric.

7. The high-frequency-proof housing according to claim 1, wherein the housing cover is provided with one or more electrically conductive contact regions positioned in a plane, via which the housing cover rests on the plurality of contact portions and is galvanically contacted with the housing via the plurality of contact portions.

8. The high-frequency-proof housing according to claim 7, wherein the gap between the housing and the housing cover in the regions of the depressed or recessed second portions of said housing edge and/or the depressed or recessed portions of said housing cover and/or a length of the plurality of contact portions have a length which is less than a wavelength of an average operating frequency of said high-frequency-proof housing or less than a half-wavelength of the average operating frequency.

9. The high-frequency-proof housing according to claim 7, wherein a length of the depressed or recessed second portions of said housing edge and/or a length of the depressed or recessed portions of said housing cover and/or a length of the plurality of contact portions have a length which is greater than 1/40 of a wavelength of an average operating frequency of said high-frequency-proof housing or greater than 1/30 of the wavelength of the average operating frequency.

10. The high-frequency-proof housing according to claim 7, wherein a length of the protruding first portions of said housing edge and/or the protruding portions of said housing cover is less a wavelength of an average operating frequency of said high-frequency-proof housing or less than a half-wavelength of the average operating frequency.

11. The high-frequency-proof housing according to claim 7, wherein a length of the protruding first portions of said housing edge and/or the protruding portions of said housing cover is greater than 1/80 of a wavelength of an average operating frequency of said high-frequency-proof housing or greater than 1/70 of the wavelength of the average operating frequency.

12. The high-frequency-proof housing according to claim 1, wherein the housing cover consists of a non-conductive material or a circuit board material which is coated with an electrically conductive layer, the isolation portions being formed without an electrically conductive layer or an electrically conductive layer being removed.

13. The high-frequency-proof housing according to claim 1, wherein the housing, including the housing edge, is formed of a non-conductive material or circuit board material and coated with an electrically conductive layer, the housing edge being formed without an electrically conductive layer in the housing isolation portions or an electrically conductive layer being removed.

14. The high-frequency-proof housing according to claim 1, wherein the housing cover and/or the housing edge of the housing consists of an electrically conductive material or is/are coated with an electrically conductive material, and the isolation portions are formed by an electrically non-conductive coating.

15. The high-frequency-proof housing according to claim 1, wherein the gap between the housing cover and the housing edge is covered by a housing cover edge or a housing cover flange.

16. The high-frequency-proof housing according to claim 15, wherein a spacing is formed between the housing cover edge or the housing cover flange and an outer face of the housing wall.

17. The high-frequency-proof housing according to claim 15, wherein a height of the housing cover edge or a height of the housing cover flange is greater than a height of the gap.

18. The high-frequency-proof housing according to claim 15, wherein a height of the housing cover edge or a height of the housing cover flange is at least 1.5 times a thickness of the housing cover.

19. A high-frequency-proof filter housing, comprising:
a housing comprising a housing base and a housing wall rising from the housing base,
a housing cover positioned on a housing edge formed on the housing wall of the housing to form a complete housing,
the housing and/or the housing cover consisting of an electrically conductive material or of a dielectric material coated with an electrically conductive layer,
the housing cover having a plurality of fastening holes which are aligned with corresponding holes in the housing wall,
the housing cover being fastened or fastenable to the housing by a plurality of screw connections, the screw connections comprising fastening screws which penetrate the plurality of fastening holes in the housing cover and engage in the holes axially aligned therewith in the housing wall of the housing,
the housing cover and the housing being galvanically contacted in a mounted state,
a plurality of contact portions arranged in a mutually offset manner formed or provided between the housing cover and the housing,
isolation portions formed or provided in regions of which the housing cover and the housing and galvanically isolated between the plurality of contact portions,
the plurality of contact portions being formed on the housing cover in the form of housing cover contact portions, which comprise mutually offset housing cover portions that are positioned in succession and protrude towards the housing,
the isolation portions comprising housing cover isolation portions which include portions of said housing cover that are depressed or recessed with respect to the housing and are arranged between the protruding housing cover contact portions,
a gap which provides galvanic isolation between the housing wall and the housing cover in regions of the depressed or recessed portions of said housing cover,
the plurality of screw connections being provided in the plurality of contact portions in regions of which the housing cover is galvanically contacted with the housing, and
the housing cover is rigidly connected to the housing by the plurality of screw connections only in the plurality of contact portions.

20. The high-frequency-proof housing according to claim 19, wherein the housing edge is provided with one or more electrically conductive contact regions that are positioned in a plane and on which the housing cover is positioned by said plurality of contact portions formed on the protruding portions of said housing cover and is galvanically contacted with the housing via said plurality of contact portions.

21. A high-frequency-proof device, comprising:
a housing comprising a housing base and a housing wall rising from the housing base,
a housing cover positioned on a housing edge formed on the housing wall to form a complete housing, the housing cover having a plurality of fastening holes which are aligned with corresponding holes in the housing wall, the housing cover and the housing consisting of an electrically conductive material or of a dielectric material coated with an electrically conductive layer and being galvanically contacted in a mounted state;

the housing cover being fastened or fastenable to the housing by a plurality of fastening screws which penetrate the plurality of fastening holes in the housing cover and engage in the corresponding holes axially aligned therewith in the housing wall;

a plurality of contact portions arranged in a mutually offset manner formed or provided between the housing cover and the housing, the plurality of contact portions being formed on the housing cover in the form of housing cover contact portions, which comprise mutually offset portions of said housing cover that are positioned in succession and protrude towards the housing, the plurality of fastening screws being provided in the plurality of contact portions in regions of which the housing cover is galvanically contacted with the housing;

isolation portions formed or provided in regions of which the housing cover and the housing are galvanically isolated between the plurality of contact portions, the isolation portions comprising housing cover isolation portions which include portions of said housing cover that are depressed or recessed with respect to the housing and are arranged between the protruding portions of said housing cover;

the housing wall and the housing cover defining a gap therebetween which provides galvanic isolation between regions of the depressed or recessed portions of said housing cover; and the housing cover being rigidly connected to the housing by the plurality of fastening screws only in the plurality of contact portions.

\* \* \* \* \*